United States Patent [19]

Alvarez et al.

[11] Patent Number: 5,696,029

[45] Date of Patent: Dec. 9, 1997

[54] PROCESS FOR MANUFACTURING A LEAD FRAME

[75] Inventors: Robert Alvarez, Garland; Anthony M. Chiu, Richardson, both of Tex.; Jay Alexander, N. Attleboro, Mass.

[73] Assignee: Texas Instruments Incorporated, Dallas, Tex.

[21] Appl. No.: 665,062

[22] Filed: May 15, 1996

Related U.S. Application Data

[63] Continuation of Ser. No. 443,042, May 17, 1995, abandoned, which is a continuation of Ser. No. 114,705, Aug. 31, 1993, abandoned.

[51] Int. Cl.$^6$ .......................... H01L 21/56; H01L 21/60; H01L 21/70
[52] U.S. Cl. ............................................ 437/207; 437/220
[58] Field of Search ...................... 437/206, 207, 437/220; 257/672, 676

[56] References Cited

U.S. PATENT DOCUMENTS

| | | | |
|---|---|---|---|
| 4,195,193 | 3/1980 | Grabbe et al. | 174/52 FP |
| 4,204,317 | 5/1980 | Winn | 29/827 |
| 4,258,321 | 3/1981 | Inaba | 357/70 |
| 4,835,120 | 5/1989 | Mallik et al. | 437/209 |
| 4,868,635 | 9/1989 | Frechette et al. | 357/70 |
| 4,984,059 | 1/1991 | Kubota et al. | 357/78 |
| 4,999,700 | 3/1991 | Dunaway et al. | 357/70 |
| 5,249,354 | 10/1993 | Richman | 29/827 |
| 5,327,008 | 7/1994 | Djennas et al. | 257/666 |
| 5,409,866 | 4/1995 | Sato et al. | 437/211 |

FOREIGN PATENT DOCUMENTS

| | | | |
|---|---|---|---|
| 54-55169 | 5/1979 | Japan . | |
| 54-141565 | 11/1979 | Japan . | |
| 61-216354 | 9/1986 | Japan | 437/220 |
| 62-205653 | 9/1987 | Japan | 437/220 |
| 1185961 | 7/1989 | Japan | 257/666 |
| 2197158 | 8/1990 | Japan | 437/220 |
| 36850 | 1/1991 | Japan | 437/220 |
| 3211761 | 9/1991 | Japan | 257/676 |
| 4139866 | 5/1992 | Japan | 257/672 |

*Primary Examiner*—David Graybill
*Attorney, Agent, or Firm*—Ronald O. Neerings; James C. Kesterson; Richard L. Donaldson

[57] ABSTRACT

A lead frame design and manufacturing process comprising a lead frame (18) having its internal lead fingers (20) punched out to dimensions optimized to accommodate the body size of a selected die. A die pad (30), also optimized to accommodate the body size of the selected die, is attached to the lead frame with mechanical or chemical bonding. Punches are used to punch out the internal lead pins according to selected dimensions.

13 Claims, 4 Drawing Sheets

PROCESS FOR MANUFACTURING A LEAD FRAME

This application is a Continuation of application of Ser. No. 08/443,042 filed May 17, 1995 abandoned which is a Continuation of application Ser. No. 08/114,705 filed Aug. 31, 1993 (now abandoned).

FIELD OF THE INVENTION

The present invention relates to the field of semiconductor device lead frames. More specifically, the present invention relates to a low cost, fast cycle time, lead frame design and manufacturing process.

BACKGROUND OF THE INVENTION

Most packaged semiconductor devices utilize a lead frame to provide die support and electrical connection between the die (via bond wires to the die's bond pads) and electrical connection points external to the package (via the lead frame's lead fingers). Lead frames are generally stamped or etched to accommodate one specific chip size in order not to exceed the maximum length of the bond wires. The technology required for stamping and etching lead frames is well known in the art. Stamped and etched lead frames each have respective advantages and disadvantages. A relatively short cycle time (presently around 4 weeks) is an advantage of etched lead frames—a disadvantage is a cost two to three times higher than comparable stamped lead frames. Stamped lead frames, on the other hand, are cheaper than etched lead frames but cycle time for new designs is lengthy (presently around 12 weeks).

Lead frame 10 of FIG. 1 is a stamped lead frame of the 144-pin variety. The lead frame includes lead fingers 12, die pad 14 and pad support arms 16. Die pad 14 is sized to accommodate a specific chip or die body size—7 mm for example. A die body of any other size requires a redesigned lead frame having a die pad 14 sized to accommodate the new die body. Such redesign is necessary even if the same number of lead fingers are to be used. As a result, various size dies must have lead frames and pads custom designed for each die body size. The result is high tooling cost, slow cycle time and minimum flexibility in pad sizes.

SUMMARY OF THE INVENTION

The present invention disclosed herein comprises a lead frame having its internal lead fingers and removable pad punched out to dimensions optimized to accommodate the body size of a selected die. A die pad, also optimized to accommodate the body size of the selected die, is attached to the lead frame with mechanical or chemical bonding.

The invention facilitates pre-application specific production and inventorying of standardized lead frames having a selected number of pins. Various sizes of die pads are also pre-produced in a process identical to the stamped lead frames. Punches are made to punch out internal lead fingers and support pads to selected dimensions. As an example, a customer might request a 144-pin packaged semiconductor device having a die body size of 8 mm. Until now, the manufacturer would have to design a new lead frame having both the requested number of pins and a die pad optimized to accommodate the 8 mm body size of the die—with the resulting lengthy cycle time and expensive punching fee. According to the present invention, the manufacturer retrieves pre-produced standardized 144-pin lead frames and pre-produced standardized die pads optimized to accommodate 8 mm die from stock. The internal lead finger and removable pads the lead frames are punched out to dimensions optimized to accommodate the 8 mm die. The die pads are attached to the lead frames using mechanical or chemical bonding.

Advantages of the invention include reduced cycle time because there is only one custom punch (for the chip size) and shared stamping tool cost for all lead frames with the same pin count.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF PREFERRED EMBODIMENTS

Figure 1:
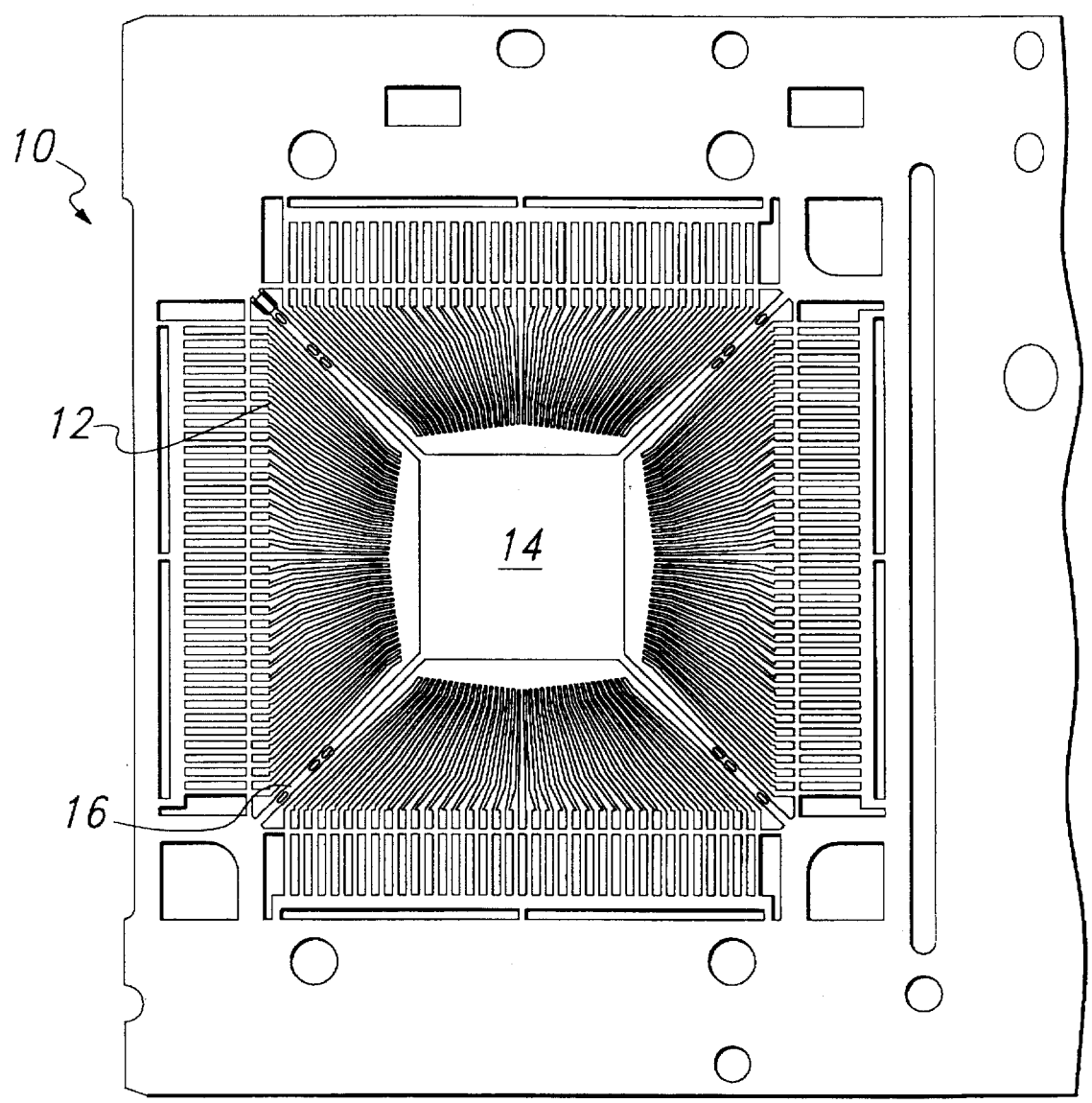
FIG. 1 is a top view of a prior art lead frame.
Figure 2:
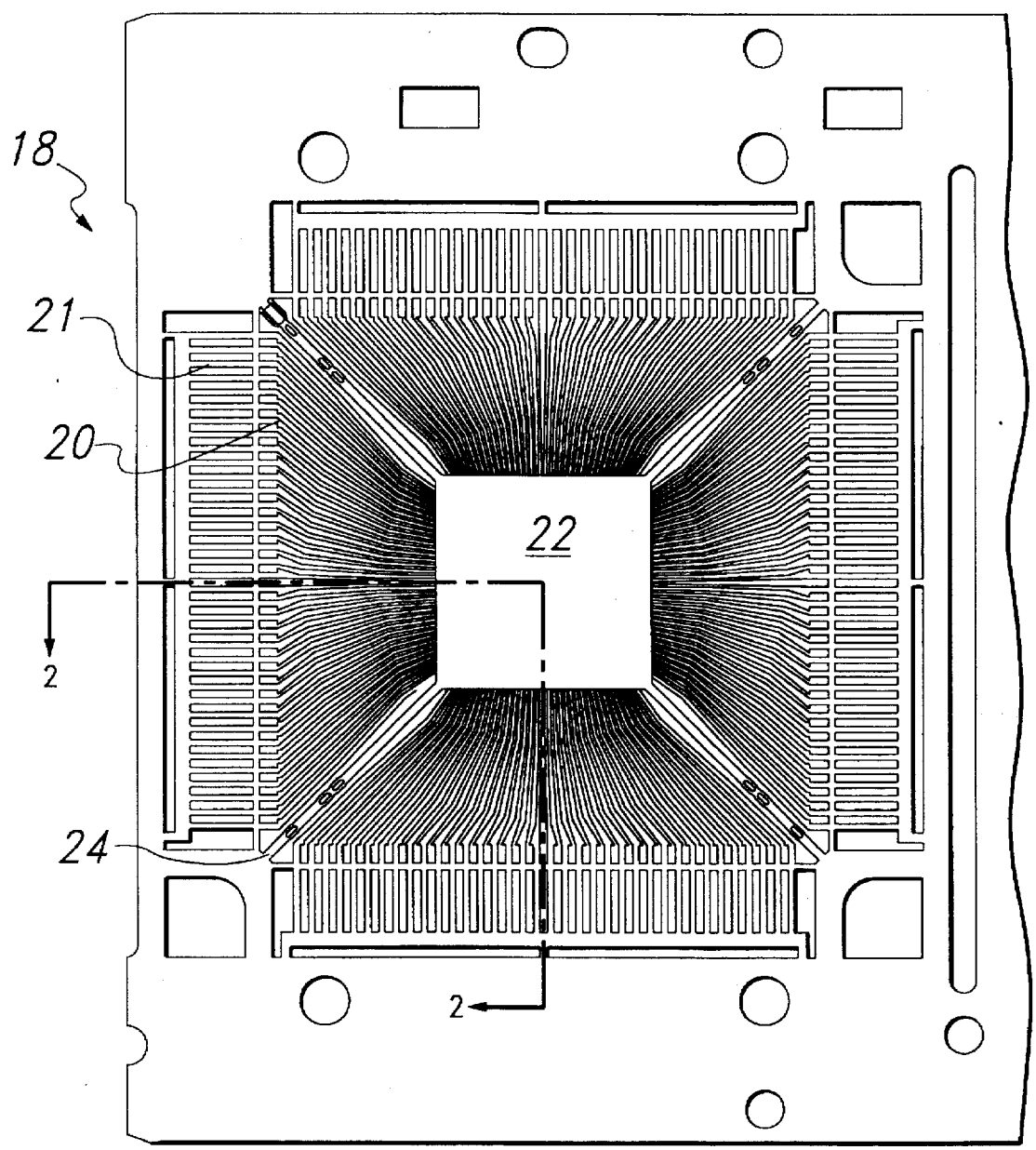
FIG. 2 is a top view of a stamped lead frame.
Figure 3:
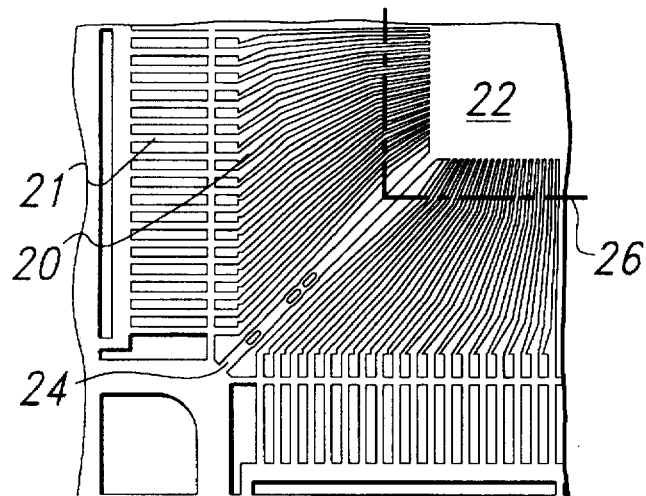
FIG. 3 is enlarged sectional view of FIG. 2 along section lines 2—2.

FIG. 2 illustrates a stamped lead frame 18 of the 144-pin variety, according to one embodiment of the invention. Lead frame 18 includes lead fingers 20 which extend into lead pins 21, structural integrity removable pad 22 and pad support arms 24. Lead fingers 20 and pad support arms 24 are connected to removable pad 22, as more clearly shown in FIG. 3 which is an enlarged view of a portion of the lead frame of FIG. 2 along the section lines 2—2. Removable pad 22 is sized smaller than the smallest die body size to be used with the 144-pin lead frame. As an example, a semiconductor manufacturer produces various devices—having body sizes of 8 mm, 9 mm, 10 mm ... , etc.,—all usable with a 144-pin lead frame. The smallest body size to be used is 8 mm. Being that the size of removable pad 22 should be smaller than the smallest die body size to be used with the 144-pin lead frame, the body size of pad 22 should be smaller than 8 mm, e.g. 6 mm. Once a lead frame has been punched, it may be plated with silver, gold or palladium, to enhance wire bonding or less. After the standard lead frame is punched, the manufacturer can clean the material and plate it with silver, gold or palladium for ease of wire bonding.

Figure 4:
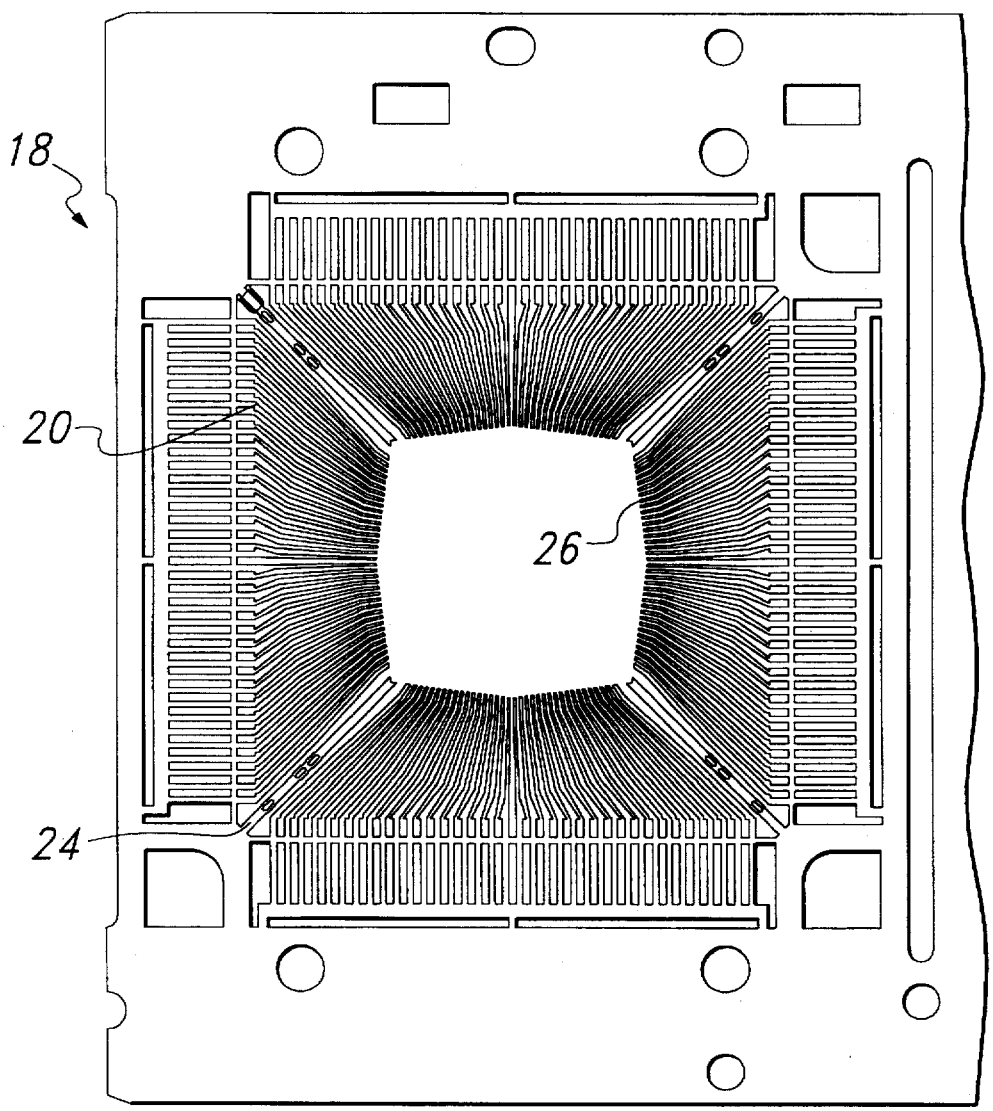
FIG. 4 is a top view of the stamped lead frame of FIG. 2 having its pad and lead fingers punched out.

Next, a punch, tooled for an 8 mm die body and whose cutting diameter will not cause bond wires interconnecting lead fingers 20 to bond pads on the die to exceed their maximum unsupported length, is used to punch a hole 26 through lead fingers 20 and die pad support arms 24, as seen in FIG. 4. Removable pad 22 is removed when hole 26 is punched.

Figure 5:
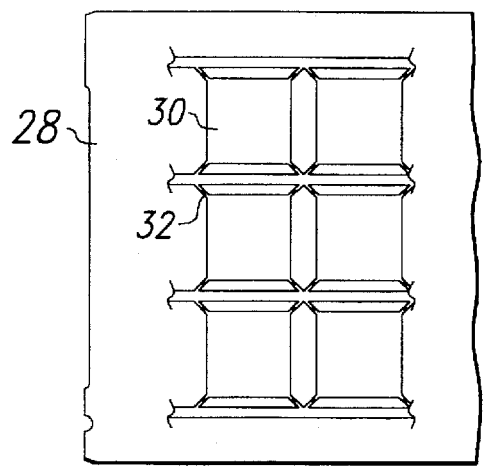
FIG. 5 is a top view of a multiple die pad frame having a multiplicity of die pads.
Figure 6:
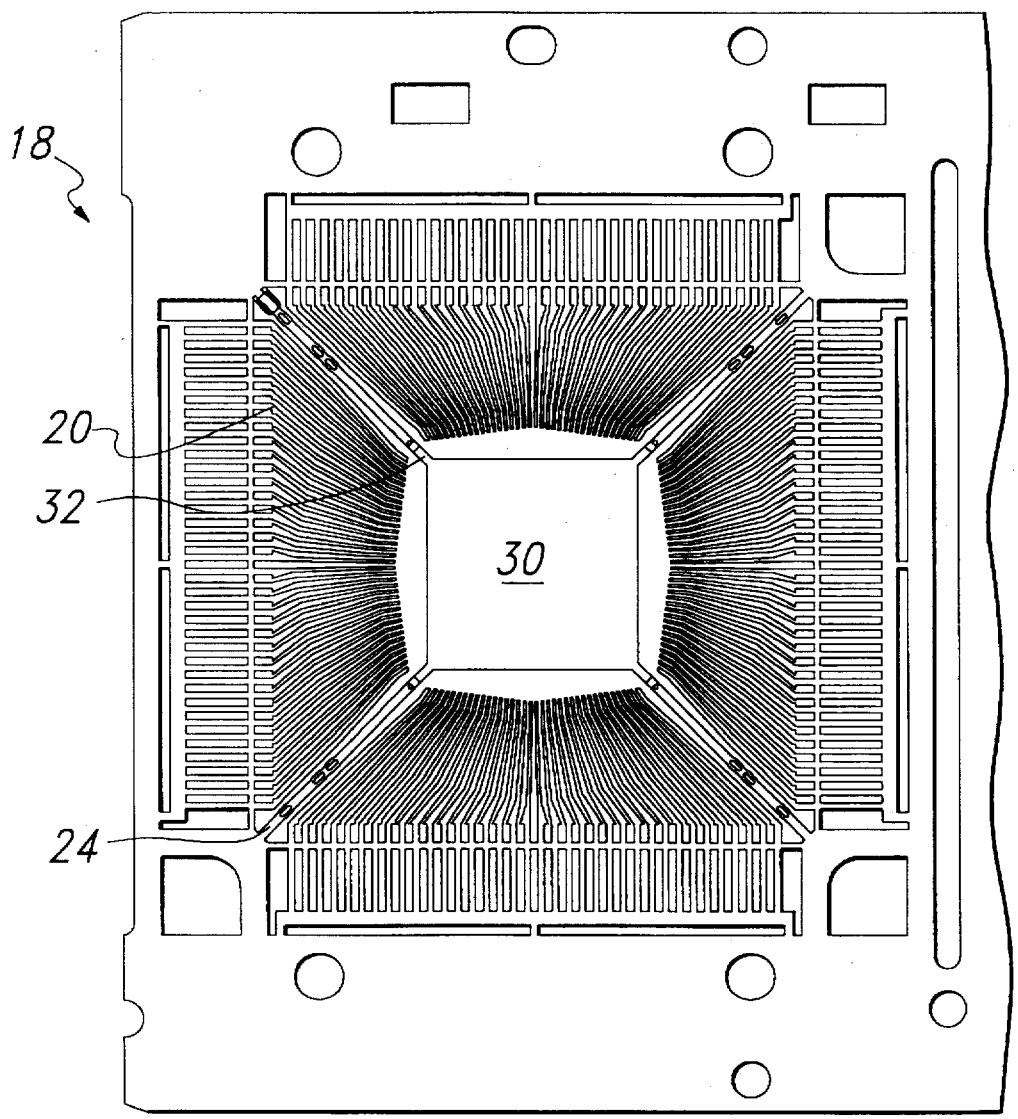
FIG. 6 is a top view of a stamped lead frame and attached die pad according to one embodiment of the invention.

FIG. 5 illustrates a multiple die pad frame 28 having a multiplicity of die pads 30. Multiple die pad frame 28 may be produced using one of many well known processes used to fabricate lead frames. In the case of FIG. 5, die pad frames 30 are stamped. Each die pad 30 is dimensioned to support a die body of a specific size, e.g., 8 mm. Each die pad 30 further has four die pad stubs 32. A die pad is selected for removal and is removed from die pad frame 28 using a cutting laser or other similar means to cut through die pad stubs 32. Next, the selected die pad 30 is positioned within hole 26 of lead frame 18 with its four die pad stubs 32 positioned and dimensioned to adjoin or adjoin and overlap pad support arms 24. Die pad stubs 32 are welded, crimped, taped or glued to support arms 24. The resulting combination of lead frame 18 and die pad 30 is shown in FIG. 6.

Lead frame 18 having attached die pad 30 is now ready to have a die body, e.g., 8 mm, positioned on die pad 30 after which lead fingers 20 are wire bonded to bond pads on the die (not shown). Packaging processes well known in the art are used to encapsulate the device after which the outer portion of the lead frame is cut and removed. The remaining exposed lead pins 21 are trimmed and bent per the package specifications.

An advantage of the present invention is that one lead frame can be adapted to more than one die body size. If, for example, the above manufacturer also has a request for a 144-pin semiconductor device having another die body size, e.g., 14 mm, the manufacturer can use a punch, tooled for a 14 mm die body and whose cutting diameter will not cause bond wires interconnecting lead fingers 20 to bond pads on the die to exceed their maximum unsupported length, to punch a hole through lead fingers 20 and die pad support arms 24 of lead frame 18 of FIG. 2. Next, a die pad dimensioned to support a 14 mm die body is removed from a die pad frame and is attached to lead frame 18 in the manner previously discussed.

The invention facilitates pre-application specific production and inventorying of standardized lead frames having a selected number of lead pins 21. A few of the most commonly used lead frames have 64, 80, 100, 144 and 176 pins. Various sizes of die pads are also pre-produced in a process identical to the stamped lead frames. Punches are made to punch out the internal lead pins according to selected dimensions. As a result, a manufacturer's inventory comprises only three categories of parts for a particular pin count package: standard lead frame, die pads of various sizes and custom punches. Advantages include reduced cycle time because there is only one custom punch (for the chip size) and a shared stamping tool cost for all lead frames with the same pin count.

While this invention has been described with reference to an illustrative embodiment, this description is not to be construed in a limiting sense. For example, a laser beam cutting device or similar cutting means could be used in lieu of the punch used to punch out the internal lead fingers. Various modifications to the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of making a lead frame, comprising:
    forming a periphery of a selected size;
    forming lead fingers and die pad support arms extending inwardly from said periphery;
    forming a die pad one of a variable number of sizes dimensioned smaller than said size of said selected size periphery;
    removing a portion of said lead fingers and said die pad support arms to form a void in said lead frame sufficient to accommodate said formed die pad; and
    connecting said die pad to said die pad support arms after said portion has been removed, said die pad being dimensioned to accommodate a die.

2. The method of claim 1 in which the die pad is welded to the die pad support arms.

3. The method of claim 2 in which lead fingers extending from said periphery toward said die pad terminate at locations spaced from said die pad.

4. The method of claim 3 in which the space between said die pad and said lead fingers will not cause bond wires connecting said lead fingers to bond pads on a die to exceed their maximum unsupported length.

5. The method of claim 1 in which said die pad includes at least one die pad stub extending from said die pad toward at least one of said die pad support arms.

6. The method of claim 1 in which said die pad includes four die pad stubs extending from said die pad toward respective die pad support arms.

7. A method, comprising:
    selecting a lead frame having a periphery one of a variable number of sizes, lead fingers and die pad support arms extending inwardly from said periphery;
    selecting a die pad from a group of variably sized die pads that could be associated with said selected size lead frame;
    removing a portion of said lead fingers and said die pad support arms to form a void in said lead frame sufficient to accommodate said selected die pad; and
    connecting said die pad to said die pad support arms after said portion has been removed, said die pad being dimensioned to accommodate a die.

8. The method of claim 7 in which said die pad includes at least one die pad stub extending from said die pad toward at least one of said die pad support arms.

9. The method of claim 7 in which said die pad includes four die pad stubs extending from said die pad toward respective die pad support arms.

10. The method of claim 7 in which said die pad is mechanically connected to said die pad support arms.

11. The method of claim 7 in which a punch is used to remove said portion of said lead fingers and said die pad support arms.

12. The method of claim 7 in which said lead fingers terminate at locations spaced from said die pad.

13. The method of claim 12 in which the space between said die pad and said lead fingers will not cause bond wires connecting said lead fingers to bond pads on a die to exceed their maximum unsupported length.

* * * * *